US006744255B1

United States Patent
Steinbrecher et al.

(10) Patent No.: US 6,744,255 B1
(45) Date of Patent: Jun. 1, 2004

(54) GROUNDING DEVICE FOR ELECTRIC POWER DISTRIBUTION SYSTEMS

(75) Inventors: Brian Todd Steinbrecher, Brookfield, WI (US); Frank John Muench, Jr., Waukesha, WI (US); John Mitchell Makal, Menomonee Falls, WI (US); David Charles Hughes, Sussex, WI (US)

(73) Assignee: McGraw-Edison Company, Houston, TX (US)

( * ) Notice: Subject to any disclaimer, the term of this patent is extended or adjusted under 35 U.S.C. 154(b) by 50 days.

(21) Appl. No.: 10/283,325

(22) Filed: Oct. 30, 2002

(51) Int. Cl.[7] .................. G01R 31/28; H01H 31/04; H01R 13/648; H01R 13/68; H02H 7/00
(52) U.S. Cl. .................. 324/511; 324/538; 324/542; 439/92; 439/621; 361/107
(58) Field of Search .................. 324/511, 509–510, 324/538, 542; 361/42, 107; 439/92–108, 621, 921; 174/5 SG, 6, 40 CC, 78

(56) References Cited

U.S. PATENT DOCUMENTS

| | | | | |
|---|---|---|---|---|
| 3,576,493 A | * | 4/1971 | Tachick et al. | 324/133 |
| 3,924,914 A | * | 12/1975 | Banner | 439/105 |
| 4,103,123 A | * | 7/1978 | Marquardt, Jr. | 200/48 R |
| 4,152,643 A | * | 5/1979 | Schweitzer, Jr. | 324/120 |
| 4,508,413 A | * | 4/1985 | Bailey | 439/550 |
| 4,779,341 A | | 10/1988 | Roscizewski | 29/876 |
| 4,857,021 A | | 8/1989 | Boliver et al. | 439/801 |
| 5,230,142 A | | 7/1993 | Roscizewski | 29/758 |
| 6,520,795 B1 | * | 2/2003 | Jazowski | 439/475 |

OTHER PUBLICATIONS

Cooper Power Systems, Service Information S500–54–1, "Loadbreak Apparatus Connectors—200 A 15, 25 & 35 kV Class Fused Test Elbow" Dec. 2001, New Issue.

* cited by examiner

Primary Examiner—Anjan K. Deb
(74) Attorney, Agent, or Firm—Fish & Richardson P.C.

(57) ABSTRACT

A grounding and testing device for power distribution systems includes an electrically insulated housing with a bore that extends from an aperture at a front of the housing towards a rear of the housing. An electrical contact is disposed at least partially within the bore, and the bore, aperture, and conductive contact are adapted to mate with a bushing. A current interrupter, such as a current limiting fuse, is electrically connected between the contact and a grounding cable. An annunciator is connected to the current interrupter such that the annunciator provides an indication when a current flows through the current interrupter. A lead is electrically connected to the contact to provide a connection point for a permanent ground connection.

23 Claims, 5 Drawing Sheets

GROUNDING DEVICE FOR ELECTRIC POWER DISTRIBUTION SYSTEMS

TECHNICAL FIELD

This description relates to electric power distribution systems, and more particularly to a combined grounding device and testing tool for use in an electric power distribution system.

BACKGROUND

In power distribution systems, high-voltage separable connectors interconnect various electrical equipment, such as transformers, switchgear, distribution cables, and the like. These connectors typically have an elbow component that mates with a bushing component.

The electrical equipment often needs to be grounded. For example, the electrical equipment must be grounded for repair or servicing, or when being moved to reconfigure or isolate parts of the system. In this case, a grounding device (e.g., a grounding elbow) is typically used to provide a visible ground.

SUMMARY

A grounding and testing device for power distribution systems includes an electrically insulated housing with a bore that extends from an aperture at a front of the housing towards a rear of the housing. An electrical contact is disposed at least partially within the bore, and the bore, the aperture, and the contact are adapted to mate with a bushing. A current interrupter, such as a current limiting fuse, is electrically connected between the contact and a grounding cable. An annunciator is connected to the current interrupter such that the annunciator provides an indication when a current flows through the current interrupter. A lead is also electrically connected to the contact to provide a connection point for a permanent ground connection.

The grounding and testing device can reduce the forces that can occur when someone accidentally, or otherwise, closes a grounding device in on an energized system. For example, if a conventional 200 A grounding elbow is closed in on an energized part of a system that has more than 10,000 amps available, the fault current can cause arcing and can result in forces capable of propelling parts. One instance in which more than 10,000 amps would be available is in a 600 A portion of the system, which is rated at 25,000 amps. However, in the grounding and testing device described, the current interrupter may be designed or chosen to control both the peak current and the fault current duration to levels that are barely detectable, thereby reducing or eliminating these responses.

Implementations of the grounding and testing device may include one or more of the following features. For example, the electrical contact may be an electrically conductive rod. Alternatively, the electrical contact may be an annular ring located near the rear of the housing. The contact may extend along an axis of the bore through the rear of the housing. The device may include an electrically conductive connector connected to a portion of the contact that extends through the rear of the housing. The lead and the current interrupter may be connected to the contact by the connector. Alternatively, the current interrupter may be connected between the torque limiting head and the eye. The connector may be connected to the contact such that the contact can be rotated without rotating the connector.

Also, an eye may be connected to a portion of the rod extending through the rear of the housing to permit manipulation of the device using a hotstick. A torque limiting head may connect the eye to the contact. A tip of the contact may be designed to engage an internal nut of a load reducing tap plug.

In addition, the bore may be conical in shape with an annular locking ring formed near the rear of housing. The bore, the aperture, and the contact may be adapted to mate with a bushing having a 200 A interface.

Further, a web may be placed on the front of the housing for sealing a connection between the housing and a bushing.

In general, the device may be used to test and ground electrical equipment in a power distribution system by connecting grounding cable to ground and determining if the annunciator indicates that current has flowed through the current interrupter. A permanent ground connection is attached to the lead if the annunciator does not indicate that a current has flowed through the current interrupter.

The described grounding and testing device has particular application for an electrical connection of an underground power distribution system that uses a 600 A separable connector with a 200 A load reducing tap plug (LRTP), where the connector and the LRTP are rated in the 15–35 KV range. However, the device can also be designed for other connections at other voltages.

The details of one or more implementations are set forth in the accompanying drawings and the description below. Other features will be apparent from the description and drawings, and from the claims.

DESCRIPTION OF DRAWINGS

Like reference symbols in the various drawings indicate like elements.

DETAILED DESCRIPTION

Figure 1:
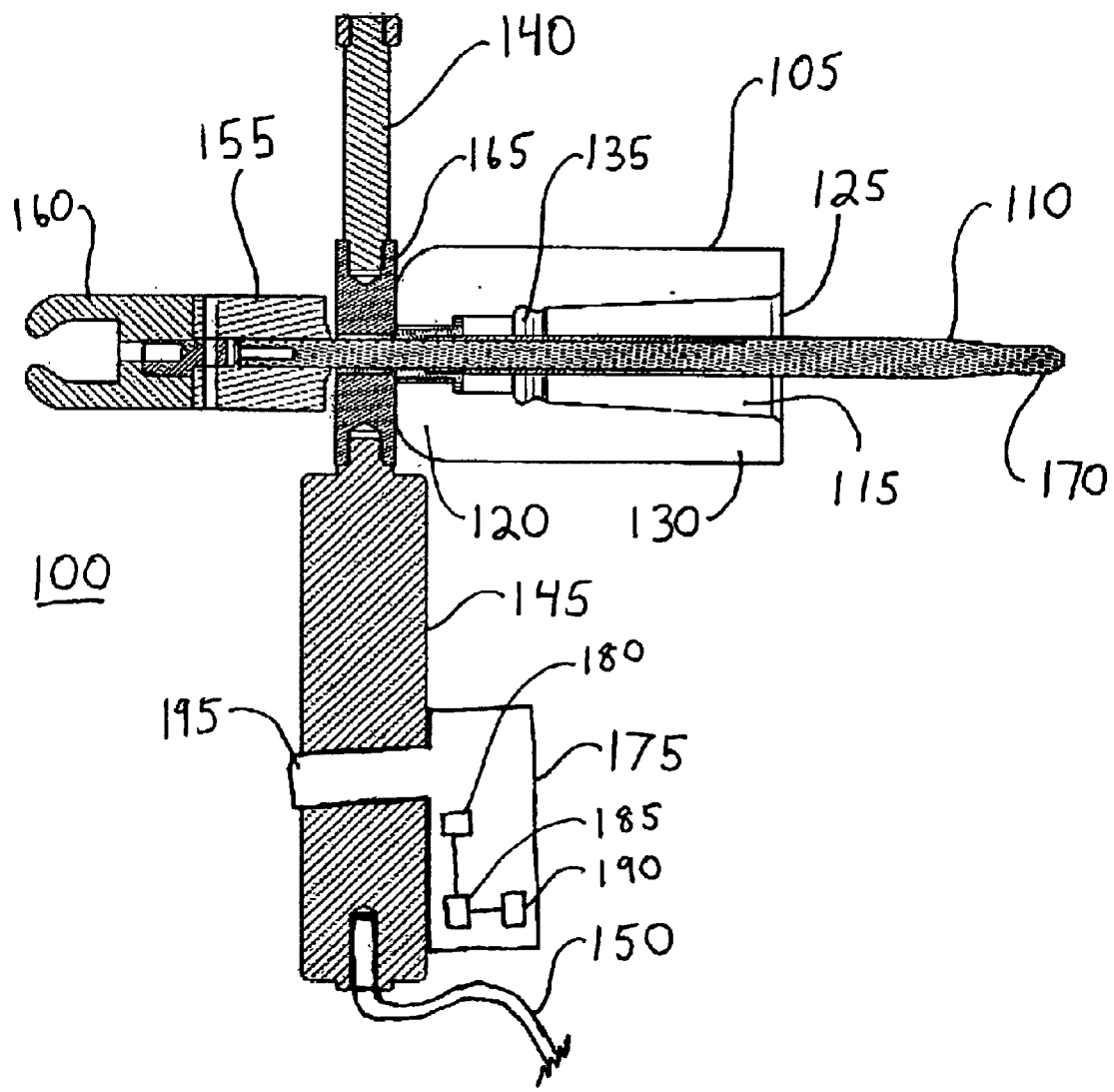
FIG. 1 is a cross-sectional view of a grounding and testing device for power distribution systems.

FIG. 1 illustrates a cross-sectional view of a grounding and testing device 100 for power distribution systems. Device 100 includes an electrically resistive housing 105 constructed from a material such as EPDM (ethylene-propylene-dienemonomer) rubber. A horizontally-oriented bore 115 within housing 105 extends from an aperture 125 at a front 130 of housing 105 towards a rear 120 of housing 105. An electrical contact 110, such as an electrically conductive rod, is disposed at least partially within bore 115. Bore 115, aperture 125, and conductive rod 110 are generally adapted to mate with a bushing of a power distribution system.

The implementation shown is adapted to mate with a 200 A interface as defined by IEEE Std 386-1995. To this end, rod 110 is aligned along the axis of bore 115, which is generally conical with an annular locking ring 135 formed near the rear 120 of housing 130.

In general, a first lead 140 is formed from an electrically conductive material and is electrically connected to rod 110 to provide a connection point for a permanent ground connection. Also, a current interrupter 145 (e.g., a fuse, a recloser, or a breaker) is electrically connected between rod 110 and a grounding cable 150. In the implementation shown, lead 140 and current interrupter 145 are attached to the rod perpendicular to the length of the rod by an electrically conductive connector 165 that is connected to a portion of rod 110 that extends through the rear 120 of housing 105. In this case, current interrupter 145 is electrically connected between rod 110 and grounding cable 150 by having a first lead attached to connector 165 and a second lead connected to grounding cable 150.

An annunciator 175 (partially shown in cross-section) is connected to current interrupter 145 such that annunciator 175 provides an indication when a current flows through current interrupter 145. In one implementation, annunciator 175 does so by using a magnetic reed switch 185 and a horn 180. In this case, when current flows through current interrupter 145 and ground cable 150, a magnetic field is created. The placement of magnetic reed switch 185 in annunciator 175 with a strap 195 holds annunciator 175 to current interrupter 145 is such that the magnetic field causes magnetic reed switch 185 to close. The closing of magnetic reed switch 185 connects horn 180 to a power source 190, which causes horn 180 to produce a sound. Other circuitry (not shown) keeps magnetic reed switch 180 closed when current interrupter 145 interrupts the current and the magnetic field dissipates. Keeping magnetic reed switch 180 closed results in the horn continuing to sound until annunciator 175 is reset.

Current interrupter 145 is designed to control the effects of an inadvertent fault close to a level that will not damage equipment, regardless of the source of fault current (e.g., an inadvertently energized bushing or a capacitively coupled voltage). For instance, in an implementation using a current limiting fuse as current interrupter 145, a current limiting fuse with a maximum interrupting current of 50 kA rms would suffice to keep the effects at a safe level for a 600 A connection with a 200 A LRTP.

An eye 160 is connected to the end of rod 110 proximate to, and extending through, the rear 120 of housing 105 for manipulation of device 100 with a hotstick. Eye 160 is connected to the end of rod 110 by a torque limiting head 155. Eye 160, torque limiting head 155, and rod 110 may be connected to each other in a manner similar to that described in U.S. Pat. No. 5,230,142, which is incorporated by reference. Tip 170 of rod 110 is designed to mate with an internal nut of a LRTP. Rod 110 is connected to connector 165 such that rod 110 can rotate without rotating connector 165.

Figure 2:
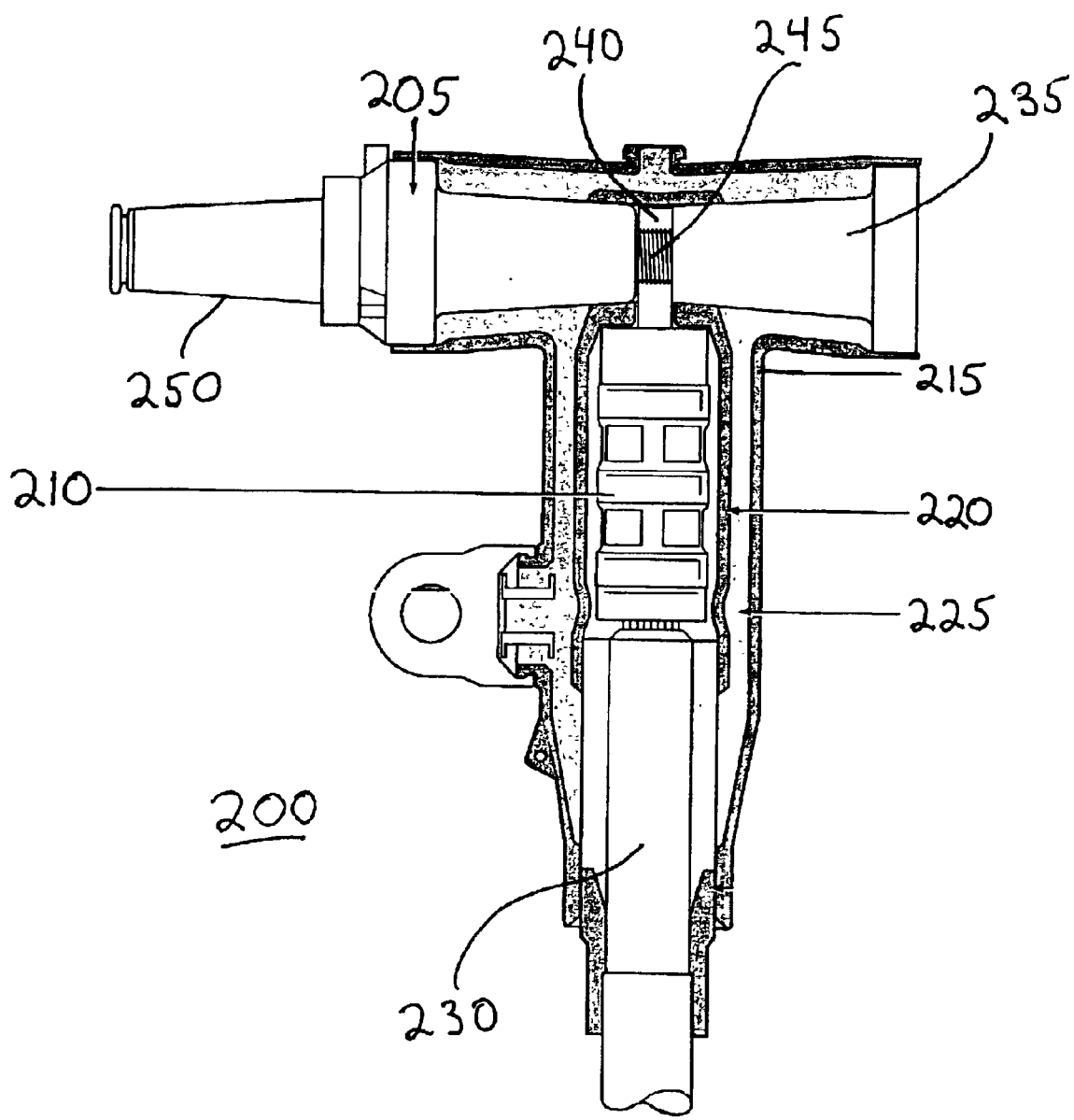
FIG. 2 is a cross-sectional view of an exemplary connection with which the grounding and testing device can be used.

FIG. 2 illustrates an exemplary connection with which grounding and testing device 100 can be used. The connection is on, for example, a 600 A portion of an underground power distribution system. Shown is a cross-section of a 600 A T-elbow connector 200 with a LRTP 205 (not shown in cross-section) connected at one of the 600 A interfaces and an apparatus bushing (not shown) connected at the other 600 A interface 235. LRTP 205 provides a 200 A interface 250.

T-elbow connector 200 includes a T-body 225 constructed from a material such as EPDM (ethylene-propylene-dienemonomer) rubber. Molded on the outside of T-body 225 is a semi-conducting shield 215 to provide ground shield continuity. A semi-conducting insert 220 is disposed within the lower extension of T-body 225 to provide electrostatic shielding for a compression connector 210 disposed within semi-conducting insert 220. A distribution cable 230 connects to compression connector 210, which connects to apparatus bushing and LRTP 205 by an extension 240 of connector 210 that extends into the upper part of elbow 200, at a point between the 600 A interfaces. LRTP 205 is mated to T-body 225 and the compression connector 210 at the threaded portion of the extension 240 with threads 245. T-connector 200 is mated to the bushing with a threaded stud (not shown) that extends into LRTP 205 through a hole in extension 240.

Figure 3:
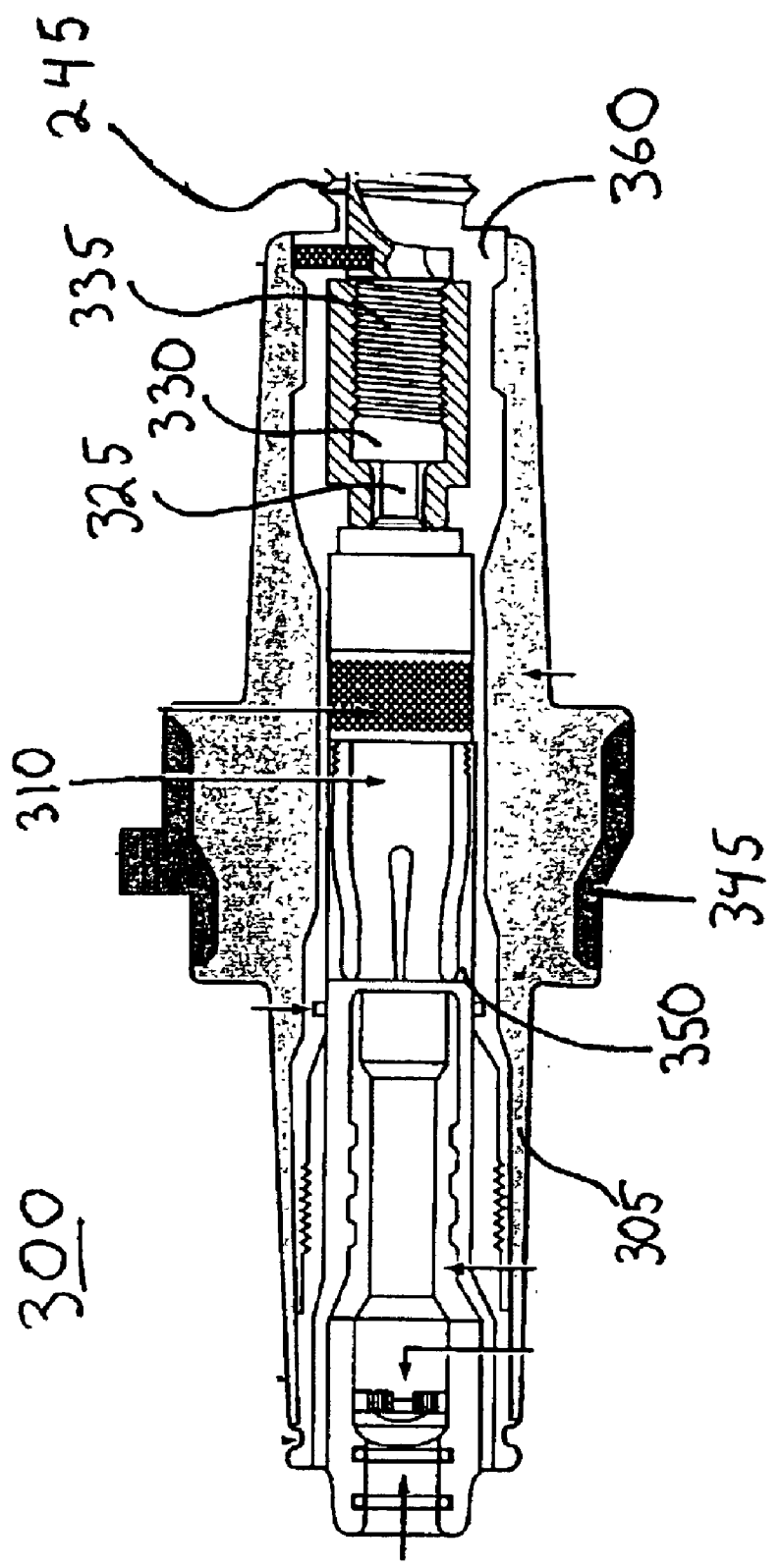
FIG. 3 is a cross-sectional view of one implementation of an LRTP for use with the connection illustrated in FIG. 2.

FIG. 3 shows a cross-section of one implementation of an LRTP 300 for use with the connection illustrated in FIG. 2. LRTP has an elastomeric insulative housing 305, formed from a material such as EDPM, and a semiconductive shield 345 surrounding a part of housing 305. An axial bore extends through housing 305 and an electrically conductive sleeve 360 is disposed in the bore. A contact assembly 350 is disposed within sleeve 360 and includes a female contact 310 to generally receive a male contact probe. An internal nut 330 with a threaded aperture 335 and a hex shaped head 325 is also located within sleeve 360. An axial passage (not shown) extends through the end of contact 310 to head 325 such that rod 110, when inserted into LRTP 300 and extending through contact assembly 350, engages head 325 with tip 170.

Attached to sleeve 360 is the threaded, electrically conductive tubular member 245. Tubular member has an axial opening to threaded aperture 335. The threaded stud that connects the apparatus bushing and LRTP 300 extends through this opening and is threaded to aperture 335.

Similar connectors and the manner of their connection are more fully described in U.S. Pat. Nos. 4,779,341 and 4,857,021, which are incorporated by reference.

The following is a description of a typical manner of using device 100, implemented as shown in FIG. 1, with the connection shown in FIG. 2 to test the deenergized state of cable 230 and provide a visible ground for cable 230 and any bushing to which cable 230 may be connected. Typically, the operation of current interrupter 145 and annunciator 175 are first verified before using device 100. Current interrupter 145 may be tested with an ohmmeter. Annunciator 175 may have a means, such as a switch placed in parallel with magnetic reed switch 185 and actuated by an external button, to facilitate a user in testing annunciator 175. Actuation of the external button causes horn 180 to sound so as to verify the operation of annunciator 175.

After the operation of current interrupter 145 and annunciator 175 are verified and the connection is deenergized, grounding cable 150 is connected to ground. Grounding cable 150 may be connected to ground by using, for example, a clamp connected to grounding cable 150 and a ground bus bar. Using a hotstick, grounding and testing device 100 is then mated with the 200 A interface 250 of LRTP 205 such that tip 170 of rod 100 engages the internal nut, in addition to the electrical contacts of LRTP 205.

At this point, if the connection is energized, or if for any reason fault currents occur, current interrupter 145 controls the fault magnitude by disconnecting the path to ground. If this occurs, annunciator 175 provides an indication, such as a sound, that a current has been interrupted.

If no fault currents occur, then a permanent ground connection is made to lead 140 after verifying operation of annunciator 175. The permanent ground connection may be made, for example, by connecting a clamp at one end of a permanent grounding cable to lead 140, while a clamp at the other end of the permanent ground cable is attached to the ground bus bar. For example, the permanent grounding cable may be a cable rated to 25,000 amps.

The hotstick is then used to rotate rod 110 through eye 160 such that rod 110 causes the internal nut of LRTP to unthread from stud 245. This allows LRTP 205 and T-connector 200 to be moved off of apparatus bushing 235, while grounded, if chosen. LRTP 205 and T-connector 200 are then moved to another bushing, e.g. a standoff bushing, using the hotstick with eye 160.

To be engaged with the bushing, T-connector 200 is mated with the bushing using the hotstick. Rod 110 is then rotated to thread the internal nut of LRTP 205 onto the stud attached to the bushing. Torque limiter 155 prevents too much torque from being applied to the internal nut.

Once cable 230 is repaired, or when whatever maintenance or work that required deenergization of the connection is completed, LRTP 205 and T-connector 200 are moved back onto apparatus bushing 235 using grounding and testing device 100, and the connection is energized.

Figure 4:
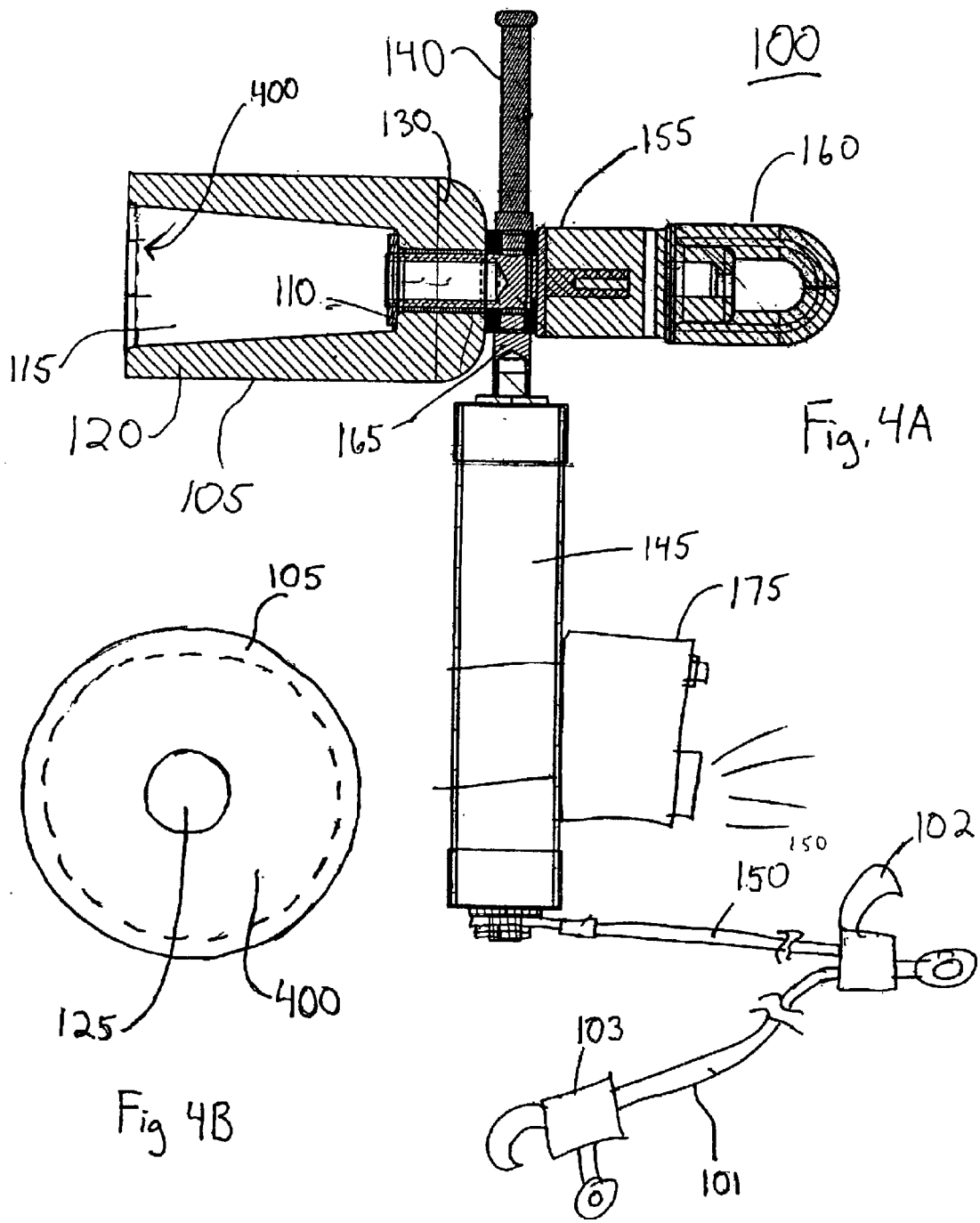
FIGS. 4 and 5 are cross sectional views of other grounding and testing device.

Referring to FIGS. 4A and 4B, in other implementations a web may be placed on the front end 130 of housing 105 to prevent an alternate path to ground from being formed by ionized gases resulting from an inadvertent connection of device 100 to an energized bushing. As shown, a web 400 is formed at the front end 130 of housing 105. Web 400 extends axially from housing 105 to contact 110, leaving aperture 125.

The implementation shown in FIGS. 4A and 4B is adapted for mating with a 600 A interface. To this end, instead of a conductive rod, electrical contact 110 is an annular conductive ring around the opening of a threaded passageway near the rear 120 of housing 105. In use, the passageway threads onto a threaded member connected to a 600 A bushing.

For an implementation such as that shown in FIG. 4A, if a bushing is inadvertently energized when device 100 is placed on the bushing, an arc is likely to occur from the energized contact of the bushing to the grounded contact 110. This arc can produce ionized gases that present another possible path to ground that bypasses current interrupter 145 and nullifies the protective features of current interrupter 145. Web 400 on the end 130 of housing 105 seals the device-bushing interface. Since current interrupter 145 can limit the energy released from the dielectric breakdown, such a seal can prevent gas flow to adjacent grounds, thereby limiting the risk to the operator.

FIG. 4A also shows an implementation using a permanent ground cable 101 (e.g., a 25,000 amp rated cable) for the permanent ground connection with a clamp 102 common to both grounding cable 150 and permanent ground cable 101. In this implementation, to ground grounding cable 150, clamp 102 is connected to the ground bus bar. If no fault currents occur, a clamp 103 at the other end of permanent ground cable 101 is then connected to lead 140 to provide the permanent ground connection.

Figure 5:
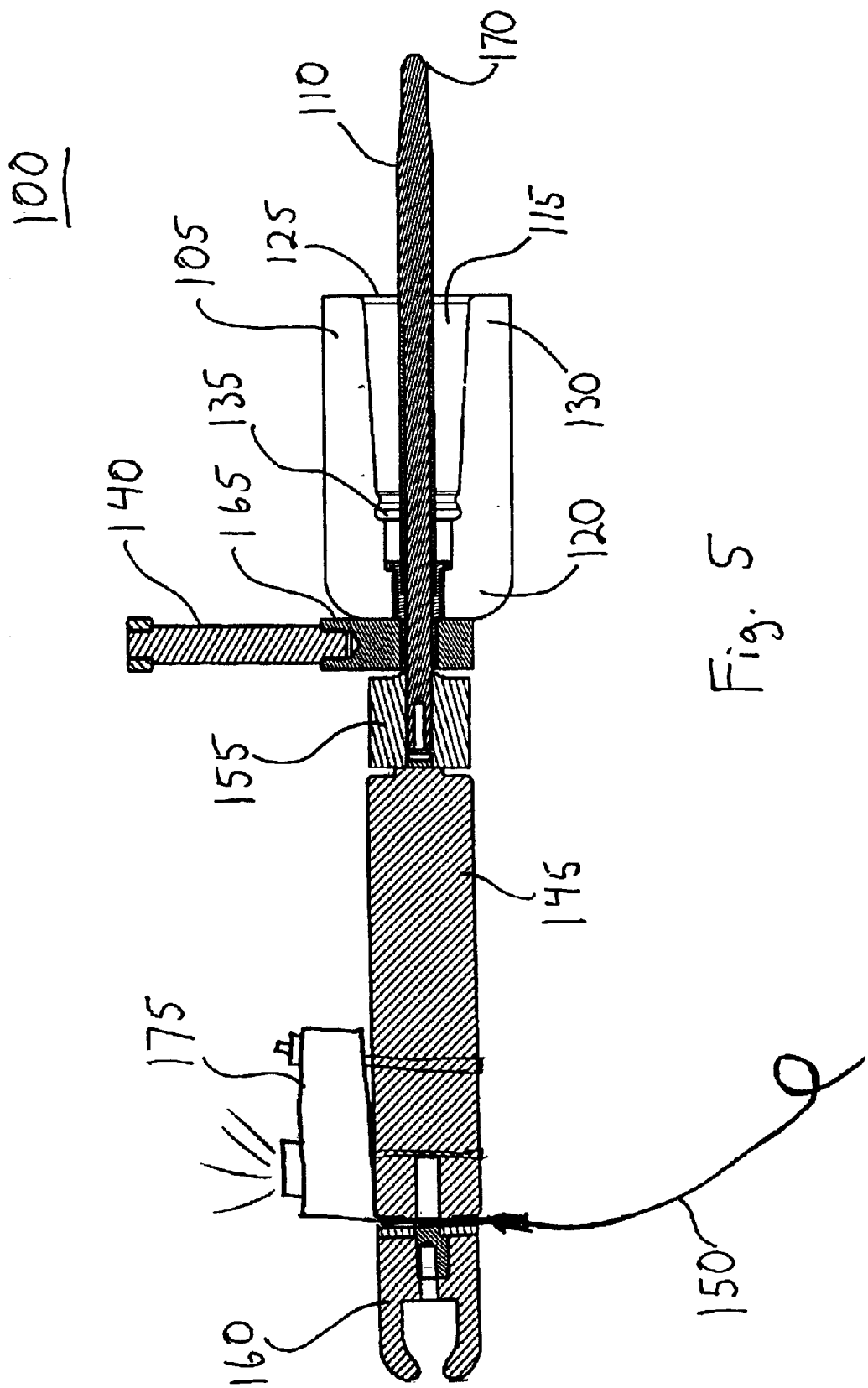

Referring to FIG. 5, other implementations may connect current interrupter 145 in-line with rod 110. That is, current interrupter 145 is disposed along the same axis as rod 110 and one lead of current interrupter 145 is electrically connected to the end of rod 110 that extends through the rear 120 of housing 105. In this implementation, current interrupter 145 is placed in-line between eye 160 and torque limiting head 155. One lead of current interrupter 140 is connected to rod 110 by torque limiting head 155. The end of current interrupter 145 opposite torque limiting head 155 is connected to eye 160, and grounding cable 150 is connected to the other lead at that end. In this implementation, the ground cable is farther away from the potentially energized bushing during installation, and the size of device 100 approaching the bushing may be smaller.

A number of implementations have been described. Nevertheless, it will be understood that various modifications may be made. For example, the device can be adapted for other types of connections and interfaces. Accordingly, other implementations are within the scope of the following claims.

What is claimed is:

1. A grounding and testing device for power distribution systems comprising:
   an electrically insulated housing with a bore that extends from an aperture at a front of the housing towards a rear of the housing;
   an electrical contact disposed at least partially within the bore, wherein the bore, the aperture, and the contact are adapted to mate with a bushing;
   a current interrupter electrically connected between the contact and a grounding cable;
   an annunciator connected to the current interrupter such that the annunciator provides an indication when a current flows through the current interrupter; and
   a lead electrically connected to the contact to provide a connection point for a permanent ground connection.

2. The device of claim 1 wherein the electrical contact is an electrically conductive rod.

3. The device of claim 2 wherein the rod extends along an axis of the bore through the rear of the housing, the device further comprising an electrically conductive connector connected to a portion of the rod that extends through the rear of the housing, wherein the lead and the current interrupter are connected to the rod by the connector.

4. The device of claim 3 wherein the connector is connected to the rod such that the rod can be rotated without rotating the connector.

5. The device of claim 4, further comprising an eye connected to a portion of the rod extending through the rear of the housing for manipulation of the device with a hotstick.

6. The device of claim 5 wherein the bushing is part of a load reducing tap plug and a tip of the rod is designed to engage an internal nut of the load reducing tap plug.

7. The device of claim 6, further comprising a torque limiting head connecting the eye to the rod.

8. The device of claim 7 wherein the bore is conical in shape with an annular locking ring formed near the rear of housing.

9. The device of claim 8 wherein the bore, the aperture, and the rod are adapted to mate with a 200 A interface of the bushing.

10. The device of claim 9 wherein the current interrupter is a current limiting fuse.

11. The device of claim 2 wherein the rod extends along an axis of the bore through the rear of the housing, the device further comprising an eye connected to a portion of the rod extending through the rear of the housing for manipulation of the device with a hotstick.

12. The device of claim 11 wherein the bushing is part of a load reducing tap plug and a tip of the rod is designed to engage an internal nut of the load reducing tap plug.

13. The device of claim 12, further comprising a torque limiting head connecting the eye to the rod.

14. The device of claim 13 wherein the current interrupter connected between the torque limiting head and the eye.

15. The device of claim 1 wherein the annunciator comprises:
   a magnetic reed switch that closes in response to a magnetic field resulting from current flowing through current interrupter;

a horn;

a power source; and wherein the magnetic reed switch closing causes the horn to be connected to the power source so that the horn creates an audible sound.

16. The device of claim 1 wherein the current interrupter is a current limiting fuse.

17. The device of claim 1, further comprising a web placed on the front of the housing for sealing a connection between the housing and a bushing.

18. The device of claim 1 wherein the electrical contact is an electrically conductive annular ring near the rear of the housing.

19. A grounding and testing device for power distribution systems comprising:

an electrically insulated housing with a horizontally-oriented bore that extends from an aperture at a front of the housing towards a rear of the housing, wherein the bore is conical in shape;

an electrical contact disposed at least partially within the bore;

a current limiting fuse electrically connected between the contact and a grounding cable;

an annunciator connected to the current limiting fuse such that the annunciator provides an indication when a current flows through the current limiting fuse;

an electrically conductive connector connected to a portion of the contact that extends through the rear of the housing;

a lead electrically connected to the contact to provide a connection point for a permanent ground connection, wherein the lead is connected to the contact by the connector;

an eye connected to a portion of the contact extending through the rear of the housing for manipulation of the device with a hotstick; and a torque limiting head connecting the eye to the contact.

20. The device of claim 19 wherein the connector is connected to the contact such that the contact can be rotated without rotating the connector.

21. The device of claim 19 wherein the current limiting fuse is connected between the torque limiting head and the eye.

22. The device of claim 19 wherein the current limiting fuse is connected to the contact by the connector.

23. A method of grounding and testing electrical equipment in a power distribution system, the method comprising the steps of:

providing a grounding and testing device, the grounding and testing device comprising:

an electrically insulated housing with an electrical contact disposed at least partially within the housing, wherein the housing and the contact are adapted to mate with a bushing;

a current interrupter electrically connected between the contact and a grounding cable;

an annunciator connected to the current interrupter to provide an indication when a current flows through the current interrupter; and a lead electrically connected to the contact to provide a connection point for a permanent ground connection;

connecting the grounding cable to ground;

mating the bore, the aperture, and the contact to a bushing;

determining if the annunciator indicates that current has flowed through the current interrupter; and attaching a permanent ground connection to the lead if the annunciator does not indicate that a current has flowed through the current interrupter.

* * * * *